(12) United States Patent
Jeong et al.

(10) Patent No.: US 7,413,452 B2
(45) Date of Patent: Aug. 19, 2008

(54) INTERCONNECTOR, METHOD FOR MANUFACTURING A PLASMA DISPLAY DEVICE USING THE SAME, AND A PLASMA DISPLAY DEVICE WITH THE SAME

(75) Inventors: Young-Chul Jeong, Suwon-si (KR); Eun-Gon Kim, Suwon-si (KR); Ki-Jung Kim, Suwon-si (KR)

(73) Assignee: Samsung SDI Co., Ltd., Suwon (KR)

( * ) Notice: Subject to any disclaimer, the term of this patent is extended or adjusted under 35 U.S.C. 154(b) by 505 days.

(21) Appl. No.: 10/969,845

(22) Filed: Oct. 22, 2004

(65) Prior Publication Data
US 2005/0110406 A1   May 26, 2005

(30) Foreign Application Priority Data
Oct. 24, 2003   (KR) .................. 10-2003-0074667

(51) Int. Cl.
*H01R 4/58* (2006.01)
(52) U.S. Cl. ....................................... 439/91
(58) Field of Classification Search ............... 439/91; 349/149–152; 174/94 R
See application file for complete search history.

(56) References Cited

U.S. PATENT DOCUMENTS

| | | | | |
|---|---|---|---|---|
| 4,600,273 | A * | 7/1986 | Ohno | 349/155 |
| 5,001,302 | A * | 3/1991 | Atsumi | 174/94 R |
| 5,180,888 | A * | 1/1993 | Sugiyama et al. | 174/94 R |
| 5,586,892 | A * | 12/1996 | Sato | 439/91 |
| 5,592,365 | A * | 1/1997 | Sugimoto et al. | 361/789 |
| 6,296,493 | B1 * | 10/2001 | Michiya | 439/66 |
| 6,424,400 | B1 * | 7/2002 | Kawasaki | 349/149 |
| 6,777,071 | B2 * | 8/2004 | Cobbley et al. | 428/323 |

FOREIGN PATENT DOCUMENTS

| | | |
|---|---|---|
| CN | 85107931 A1 | 6/1986 |
| CN | 1112297 A1 | 11/1995 |
| CN | 1217828 A1 | 5/1999 |
| JP | 03046774 A1 | 2/1991 |
| JP | 05-258830 A1 | 10/1993 |
| JP | 06-102523 | 4/1994 |
| JP | 08-186358 | 7/1996 |
| JP | 10-246894 | 9/1998 |
| JP | 11-007042 A1 | 1/1999 |
| JP | 2000-040542 | 2/2000 |

(Continued)

*Primary Examiner*—Michael C Zarroli
(74) *Attorney, Agent, or Firm*—H.C. Park & Associates, PLC

(57) ABSTRACT

A plasma display device may include a plasma display panel, a driving circuit portion for driving the plasma display panel, a connecter for electrically connecting electrodes of the plasma display panel with the driving circuit portion, and an interconnecter for electrically connecting the connecter with the plasma display panel. The interconnecter may include an adhesive layer, a plurality of conductive pellets, and a plurality of non-conductive pellets dispersed in the adhesive layer. The conductive pellets may be positioned substantially within a first region where the wiring of the connecter overlaps the electrodes of the plasma display panel. The non-conductive pellets may be positioned substantially at least at a second region other than the first region in the adhesive layer.

13 Claims, 5 Drawing Sheets

FOREIGN PATENT DOCUMENTS

| | | | |
|---|---|---|---|
| JP | 2000223534 | A1 | 8/2000 |
| JP | 2002-229055 | A1 | 8/2002 |
| JP | 2002217239 | * | 8/2002 |
| JP | 2003-157918 | A1 | 5/2003 |
| JP | 2003-176461 | A1 | 6/2003 |

* cited by examiner

INTERCONNECTOR, METHOD FOR MANUFACTURING A PLASMA DISPLAY DEVICE USING THE SAME, AND A PLASMA DISPLAY DEVICE WITH THE SAME

CROSS-REFERENCE TO RELATED APPLICATIONS

This application claims priority to and the benefit of Korean Patent Application No. 10-2003-0074667 filed on Oct. 24, 2003, the entirety of which is incorporated by reference.

BACKGROUND OF THE INVENTION

1. Field of the Invention

The present invention relates to a plasma display device, and more particularly to a structure for electrically connecting a plasma display panel with a driving circuit portion.

2. Description of the Related Art

Electrodes (for example, address electrodes) on the rear surface of a plasma display panel (PDP) electrically can connect with a driving circuit portion through a connecter (for example, a Flexible Printed Circuit (FPC)). The connecter can have a driver integrated circuit (IC) for applying an address voltage to the electrodes of the PDP in response to a control signal generated from a driving circuit portion. This address voltage may be applied to selectively form a wall voltage in each pixel.

The structures that are currently often used for applying a voltage for the PDP are classified as a chip on film (COF) that is directly installed on a connecter composed of an FPC, and a tape carrier package (TCP) that has an inexpensive and compact structure relative to the COF.

In a conventional plasma display device with the above structure, an FPC is provided with connecting terminal portions for respectively connecting the electrodes of the PDP with the driving circuit. The connecting terminal portions of the FPC electrically connect with the electrodes of the PDP by means of anisotropic conductive films (ACF). The connecting terminal portions of the FPC are constructed so as to electrically connect with the driving circuit portion by means of fitting male and female connectors together. Each of the connecting terminal portions of the FPC are provided with at least one connecting wiring set for connecting electrodes of the PDP with the driving circuit portion.

In more detail, the ACF is constructed to be interposed between the connecting terminal portions of the FPC and the electrodes of the PDP, with ball-type conductive particles dispersed in epoxy resin therein. Thus, when the connecting terminals are pressed together, the ball-type conductive particles are capable of contacting with opposing connecting terminal portions and electrodes to form electrical interconnections.

However, in the conventional ACF, since the ball-type conductive particles are dispersed not only in one region where the connecting terminal portions of the FPC face the electrodes of the PDP, but also randomly in other regions thereof, the ball-type conductive particles can conglomerate with each other in the other regions to bring about a short circuit among the neighboring connecting terminal portions of the FPC and the electrodes of the PDP.

SUMMARY OF THE INVENTION

One aspect of the present invention provides a plasma display device in which improved interconnections prevent neighboring connecting terminal portions of an FPC and electrodes of a PDP from short-circuiting.

A plasma display device according to one exemplary embodiment of the present invention may include a plasma display panel, a driving circuit portion for driving the plasma display panel, a connecter for electrically connecting electrodes of the plasma display panel with the driving circuit portion, and an interconnecter for electrically connecting the connecter with the plasma display panel. The interconnecter may include an adhesive layer, with a plurality of particles therein. The particles may include particles that have an insulating core, a conductive layer, and an insulating encapsulation. Such particles are referred to herein as pellets. In some of the pellets, the insulating encapsulation may be broken, burst, or otherwise damaged or removed. Such pellets are referred to as conductive pellets, because they are capable of conducting electricity. The undamaged pellets are referred to as non-conductive pellets because they insulate. In a connected embodiment, there may be a plurality of the conductive pellets, and a plurality of non-conductive pellets dispersed in the adhesive layer. The conductive pellets may be positioned substantially at a first region where the wiring of the connecter is overlapped with the electrodes of the plasma display panel, and the non-conductive pellets may be positioned substantially at least at a second region other than the first region in the adhesive layer.

The conductive pellets may include an insulating bead with a conductive film covering it, and at least one part of the conductive film may be exposed when an insulating capsule formed on the conductive film is broken to thereby electrically contact the driving electrode with the wiring of the connecter.

The bead may be made from polystyrene, while the conductive film may include Au and Ni coated sequentially on the bead.

The non-conductive pellets may include an insulating bead, a conductive film covering the insulating bead, and an insulating capsule formed on the conductive film, and they may further be positioned on the first region.

The size of the conductive pellets may be larger than that of some non-conductive particles (including, for example, non-conductive particles that are not pellets), and preferably the conductive pellets may have a size of about 4 to about 8 μm while the non-conductive particles may have a size of about 1 to about 2 μm.

A plasma display device according to another exemplary embodiment of the present invention includes a plasma display panel, a driving circuit portion for driving the plasma display panel, a connecter for electrically connecting electrodes of the plasma display panel with the driving circuit portion, an interconnecter for electrically connecting the connecter with the plasma display panel, and projections disposed between the wiring of the connecter and the electrodes of PDP to electrically connect them.

The projections may be formed such that they project from both the wiring and the electrodes, or from either the wiring or the electrodes, and preferably, the projections may have progressively narrower cross-sections from the wiring toward the electrodes.

The interconnecter may include an adhesive layer and a plurality of non-conductive layers dispersed in the adhesive layer.

The present invention also provides an interconnecter for electrically connecting a connecter with a plasma display panel. Such an interconnecter may have an adhesive layer and a plurality of non-conductive pellets dispersed in the adhesive layer.

An interconnecter for electrically connecting a connecter with a PDP may include an adhesive layer, a plurality of conductive pellets, and a plurality of non-conductive particles smaller than the conductive pellets, both dispersed in the adhesive layer.

The present invention also provides a method of electrically connecting a driving electrode with wiring of a connecter incorporated a driving IC via an interconnecter. The interconnector may include an adhesive layer and a plurality of non-conductive pellets dispersed in the adhesive layer. The method may include disposing the interconnecter on a portion of the panel having driving electrodes and locating the connecter on the portion of the panel to overlap the driving electrodes with the wiring of the connecter. It also may include heating and pressuring the interconnecter such that the insulating capsules of the pellets interposed between the driving electrodes and the wiring burst to enable a portion of the conductive pellets exposed from the insulating capsules to electrically connect the driving electrodes and the wiring.

DETAILED DESCRIPTION OF THE PREFERRED EMBODIMENTS

Exemplary embodiments of the present invention will now be described in detail As shown in the accompanying drawings. As used herein, "burst" refers not only to an explosive process, but also to any decompositive process by which an outer layer is removed to expose an underlayer.

Figure 1:
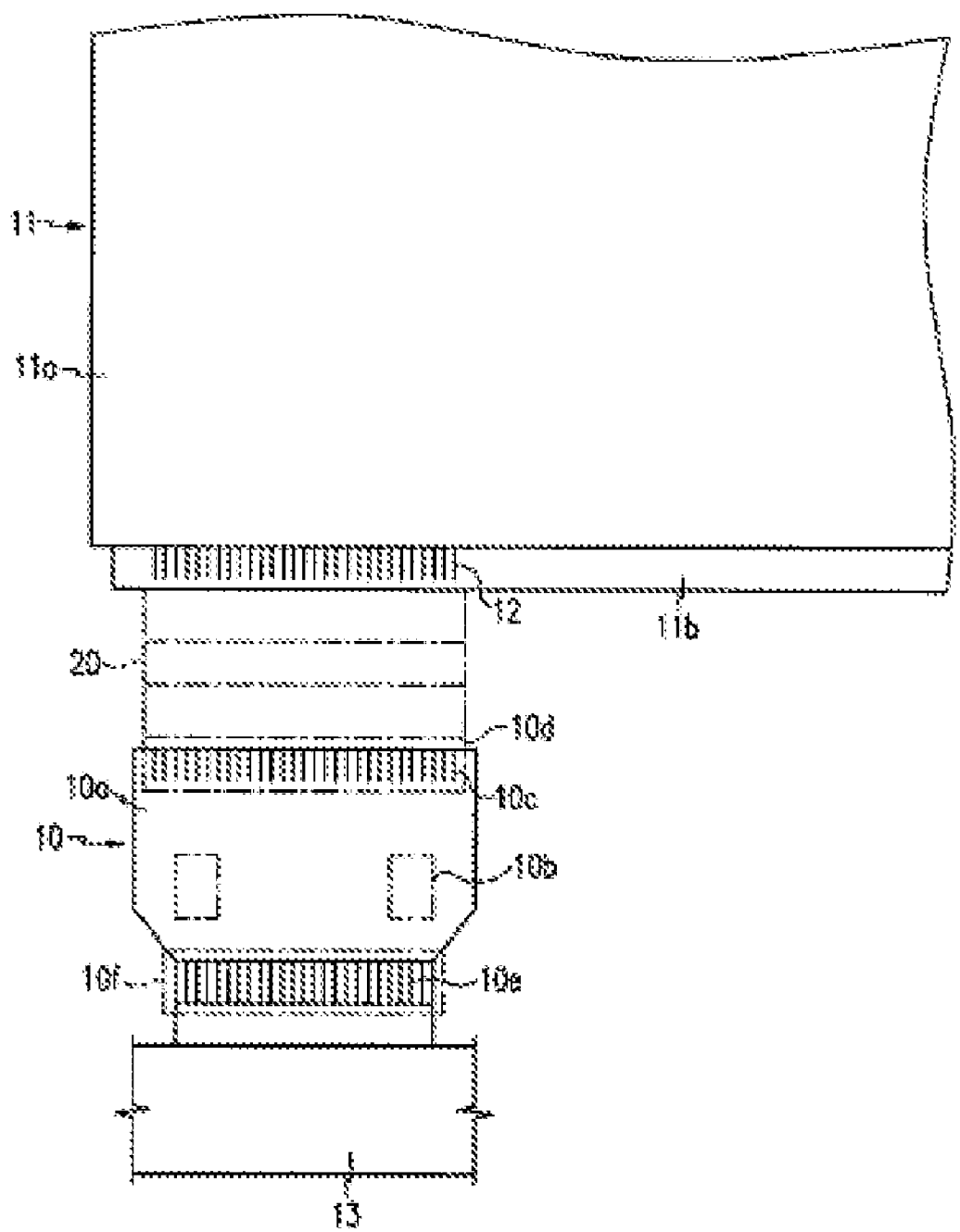
FIG. 1 is a top view schematically illustrating the structure of a plasma display device according to the present invention.

As shown in FIG. 1, a plasma display device according to the present invention may include a plasma display panel 11 (PDP), a driving circuit portion 13 for driving the PDP 11, and a connecter 10 for electrically connecting electrodes 12, which also may be referred to as driving electrodes 12, (for example, address electrodes) of the PDP 11 with the driving circuit portion 13.

In the embodiment, the connecter 10 may include a conventional COF, but it is not limited to such a structure, and it may include a TCP.

The plasma display device may include the PDP 11, mounted on a conventional chassis base (not shown), a front cover (not shown) on the outside of the PDP 11, and a rear cover (not shown) on the outside of a chassis base, fastened together by fastening means.

The PDP 11 may be provided with driving electrodes 12 extending to the periphery of substrates (11a, 11b) thereof (FIG. 1 shows address electrodes 12 extending to the periphery of the lower substrate 11b of the PDP 11), to enable the driving electrodes 12 to electrically connect with the circuit portion 13 via the connecter 10. With the above structure, the PDP 11 may be driven with desired signals from the driving circuit portion 13. The driving electrodes (for example, discharge sustain electrodes, which are not shown) extending to the periphery of the upper substrate 11a of the PDP 11 may electrically connect with the circuit portion 13 via the connecter 10.

As stated above, the driving circuit portion 13 is formed as a general type having circuit elements installed on a printed circuit board (PCB), which is mounted on one surface of the chassis base that is not attached to the PDP 11.

The FPC 10a of the connecter 10 may be provided with a first connecting portion 10d and a second connecting portion 10f, on which a Driver IC 10b may be installed. The first connecting portion 10d may have wiring 10c arranged thereon to electrically connect with the driving electrodes 12. The second connecting portion 10f may have wiring 10e arranged thereon to electrically connect with the driving circuit portion 13.

The first connection portion 10d may be adapted to electrically connect with the driving electrodes 12 via the interconnecter 20 (for example, an ACF). The second connection portion 10f may be adapted to electrically connect with the driving circuit portion by means of fitting male and female parts of the connector 10 to each other.

Figure 2:
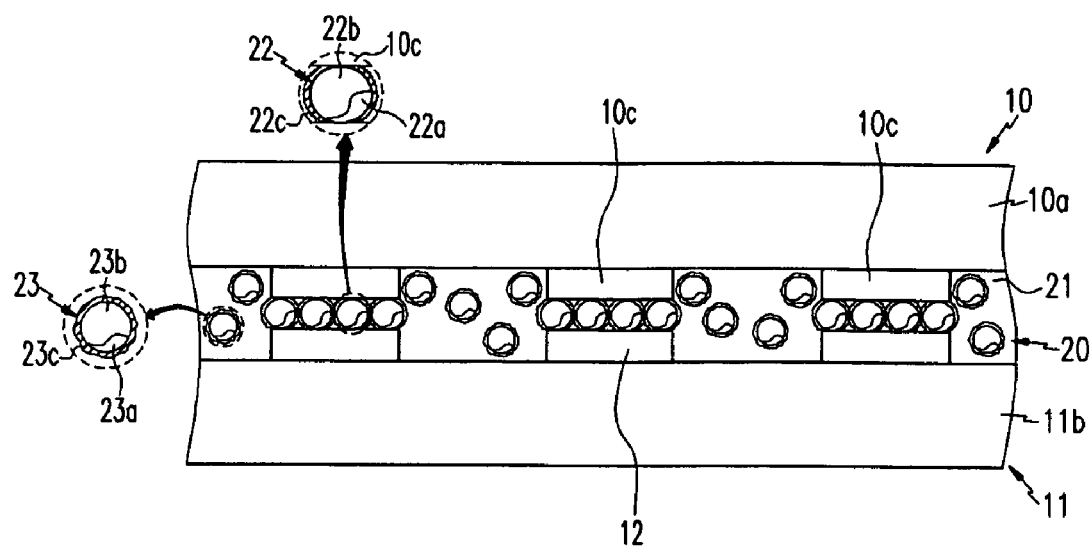
FIG. 2 is a partial cross-sectional view of the structure for connecting a connecter with a PDP according to the first embodiment of the present invention.

As shown in FIG. 2, an interconnecter 20 may be constructed such that conductive pellets 22 are arranged only in the space where the electrodes 12 face the wiring 10c. Thus, a first connection portion 10d of the connecter 10 may be connected with the driving electrodes 12 of the PDP 11. The conductive pellets 22 may be dispersed in an adhesive layer 21 made from thermoplastic resin or thermosetting resin. Accordingly, the conductive pellets 22 can serve to connect the electrodes 12 with the wiring 10c.

Also, in the space other than the space in which the electrodes 12 face the wiring 10c and in which the conductive pellets 22 are arranged, non-conductive pellets 23 are dispersed.

The conductive pellets 22 dispersed in the adhesive layer 21 can serve as a vehicle for electrically connecting the electrodes 12 and the wiring 10c when pressure is applied to the electrodes 12 and the wiring 10c to bias them toward each other.

Preferably, the conductive pellets 22 may be substantially globular-shaped plastic (preferably polystyrene) beads 22a with, for example, a Ni and/or Au conductive film 22b successively coated thereon. The insulating capsules 22c may be formed on the conductive film 22b to enable an exposed portion of the conductive film 22b (the portion facing the electrodes 12 and wiring 10c) to electrically connect the electrodes 12 with the wiring 10c when they burst while the electrodes 12 are overlapped with the wiring 10c. They may burst because pressure is applied as the electrodes 12 overlap with the wiring 10c. The insulating capsule 22c may be formed from any material that is capable of bursting under applied pressure.

The insulating capsule 22c may be formed from any insulating material that is capable of bursting under applied pressure, for example, gelatin, casein, gum arabic, gelidium jelly, cellulose, vinyl resin, vinyl plastic and the like.

Non-conductive pellets 23 are pellets in a non-conductive area. Conductive pellets 22 are pellets in a conductive area. The non-conductive pellets 23 may initially be constructed the same way as the conductive pellets 22, but they remain non-conductive because the pressure applied to them is insufficient to break their respective insulating capsules 23c. They may include a conductive film 23b coated on substantially globular shaped plastic beads 23a, and insulating capsules 23c formed on the conductive film 23b. In other words a conductive pellet 22 is a damaged (typically intentionally damaged by the application of pressure) non-conductive pellet 23.

As shown in FIGS. 3A, 3B, 3C, and 3D, a process may be used for connecting the electrodes 12 of the PDP 11 with the wiring 10c of the FPC 10 using the interconnecter 20 as discussed above.

Figure 3A:
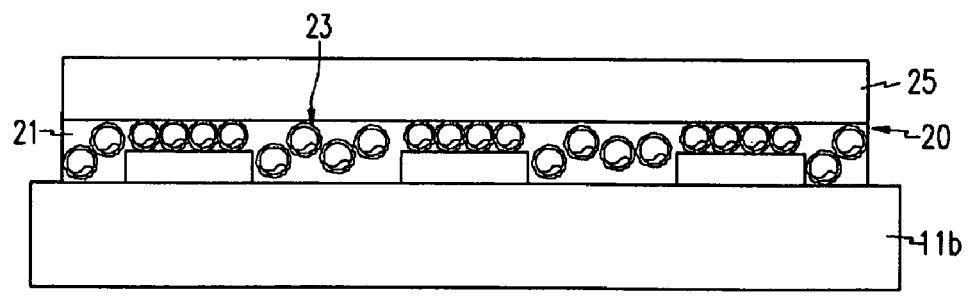
FIGS. 3A, 3B, 3C, and 3D are cross-sectional views schematically illustrating a process of forming the connecting structure of FIG. 2.

As shown in FIG. 3A, an interconnecter 20 having non-conductive pellets 23 dispersed in an adhesive layer 21 may be arranged over the electrodes 12 of the PDP 11 (or the first connecting portion 10d of the FPC 10). A separator film 25 may be removably disposed on one surface of the adhesive layer 21.

The separator film 25 can protect the adhesive layer 21 of the interconnecter 20. Thus, it may prevent undesired materials from adhering to the adhesive layer 21 before beginning an interconnection operation.

Figure 3B:
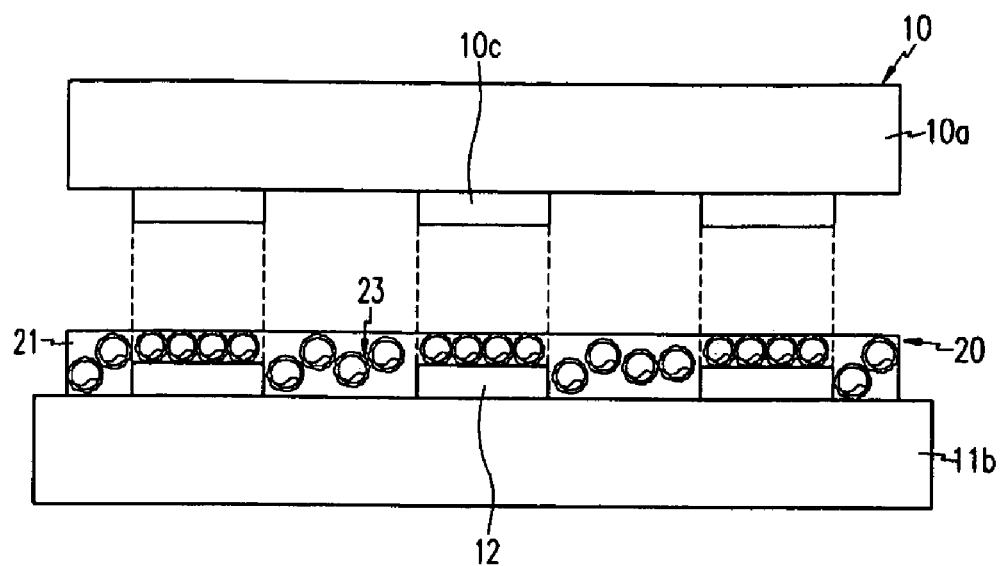

As shown in FIG. 3B, the lower substrate 11b of the PDP 11 may be adapted to overlap the first connecting portion 10d of the FPC 10 in order to enable the connecting wiring 10c to lie on the electrodes 12 of the PDP 11. The separator film 25 may be removed from the adhesive layer 21.

Figure 3C:
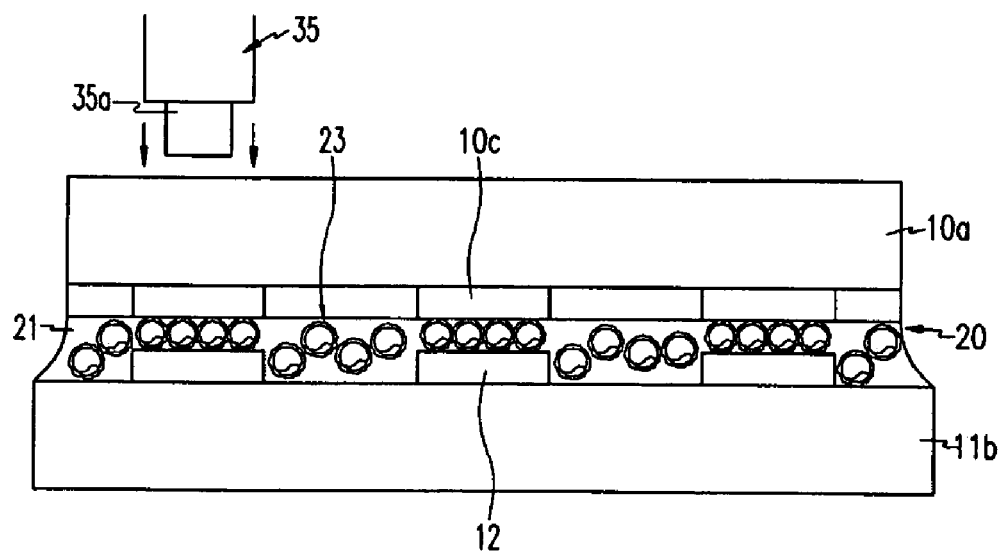

As shown in FIG. 3c, the first connecting portion 10a may be pressed by means of a pressing device 35 having a plurality of heat heads 35a from the outside of the connecter 10, at the points where the wiring 10c lies on the electrodes 12.

Figure 3D:
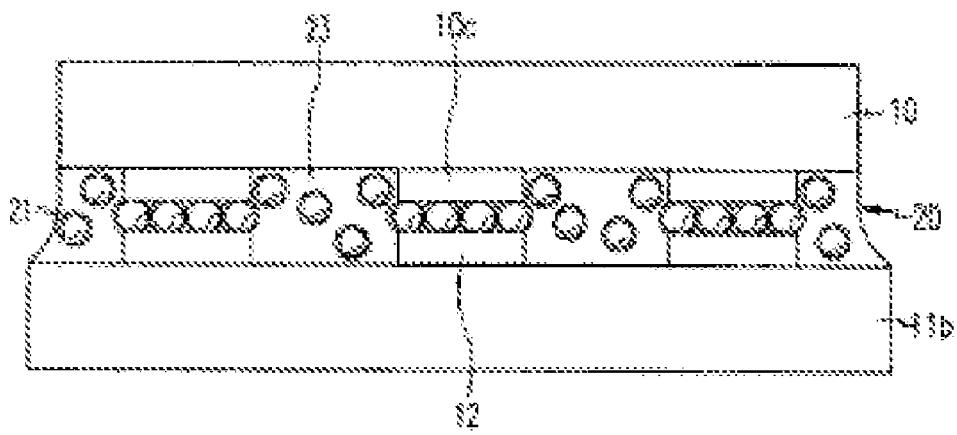

As shown in FIG. 3D, the conductive pellets 22 interposed between the electrodes 12 and the wiring 10c may burst because of the pressure applied by the pressing device 35. Accordingly, a portion of the conductive film 22b may be exposed from the burst portion thereby electrically connecting the driving electrodes 12 with the connecting wiring 10c through interposition. The non-conductive pellets 23 left at the region between the overlapped electrodes 12 and the connecting wiring 10c may remain non-conductive and may act as an insulating material.

Therefore, with the resulting structure of the interconnecter 20, the pellets 22 may enable the electrodes 12 to electrically connect with the connecting wiring 10c. The pellets 23 may lie adjacent to the neighboring electrodes 12 and connecting wiring 10c. Thus a short circuit between neighboring electrodes 12 of the PDP 11 and the connecting wiring 10c may not occur.

Figure 4:
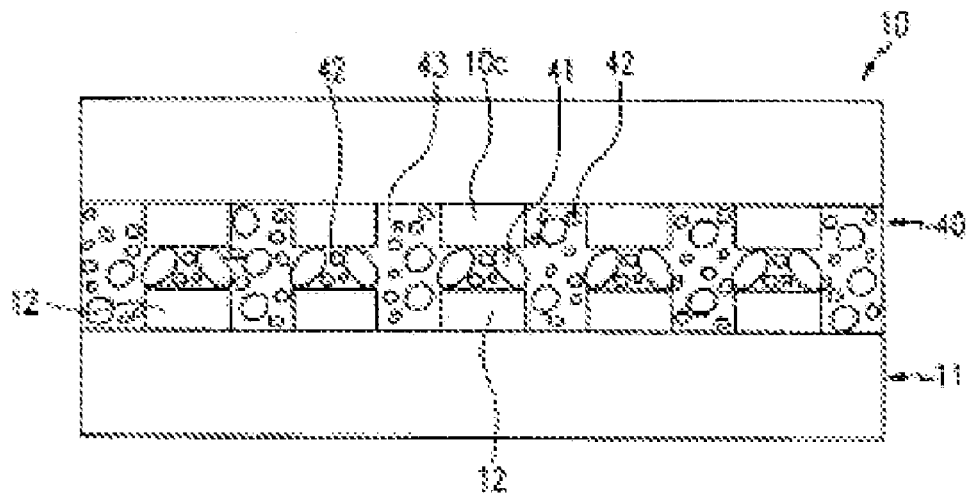
FIG. 4 is a partial cross-sectional view of the structure for connecting a connecter with a PDP according to a second embodiment of the present invention.

As shown in FIG. 4, in a second embodiment of the present invention, an interconnecter 40 used to electrically connect the PDP 11 with the connecter 10 may include conductive pellets 41 substantially interposed between the connecting wiring 10c of the connecter 20 and the electrodes 12, and non-conductive particles 42 substantially dispersed in the region of the connecter 20 that is not between the connecting wiring 10c of the connecter 20 and the electrodes 12. The non-conductive particles 42 may have a different size than the conductive pellets 41. Here, a plurality of the conductive pellets 41 and non-conductive particles 42 may be dispersed in the adhesive layer 43 in the same manner as discussed above.

The conductive pellets 41 and the non-conductive particles 42 may have substantially spherical (including ellipsoidal and the like) shapes, and the conductive pellets 41 may preferably have a size of about 4 to about 8 μm while the non-conductive particles 42 may have a size of about 1 to about 2 μm.

The conductive pellets 41 may have the same structure as in the above exemplary embodiment, and the non-conductive particles 42 may be formed from SiO2, Teflon, or polymer beads.

In order to connect the electrodes 12 of the PDP 11 with connecting wiring 10c of the connecter 10 using the interconnecter 40, a thermocompression method using a pressing device may be used as discussed in the first exemplary embodiment.

As with the interconnecter 20 according to the first exemplary embodiment, in the second embodiment the electrodes 12 may electrically connect with the wiring 10c by means of the conductive pellets 41. The non-conductive particles 42 may be dispersed uniformly in the region between the electrodes 12 and the wiring 10c and elsewhere. Thus, they can insulate between the conductive pellets 41. Therefore, a short circuit between neighboring electrodes 12 of the PDP 11 and connecting wiring 10c can be prevented when the neighboring electrodes 12 and connecting wiring 10c are connected.

Figure 5:
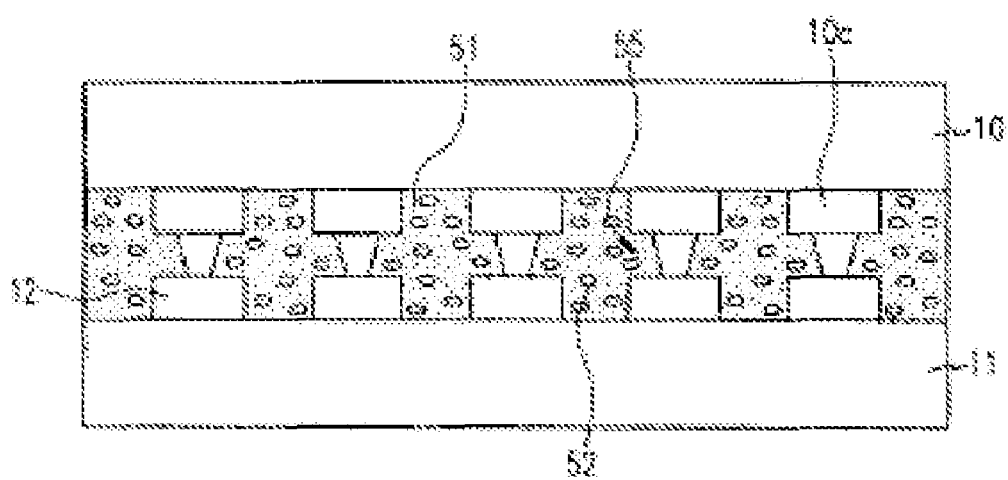
FIG. 5 is a partial cross-sectional view of the structure for connecting a connecter with a PDP according to a third embodiment of the present invention.

As shown in FIG. 5, an interconnecter 50 used to electrically connect the PDP 11 with the connecter 10 may include non-conductive particles 52 uniformly dispersed in an adhesive layer 51 made from thermoplastic resin or thermosetting resin as discussed in the second embodiment.

In the third embodiment, projections 55 may project from either the connecting wiring 10c or the electrode 12 (or both) to electrically connect them. The projections 55 may project from the connecting wiring 10c, and may be formed from a conductive material such as, for example, Au, Ni, or the like. The projections 55 may be configured such that they have a smaller cross-section the closer they are to the driving electrodes 12. Alternatively, the projections 55 may project from the electrodes 12, with an increasingly smaller cross-section toward the wiring 10c.

Also, in order to connect the electrodes 12 of PDP 11 with the wiring 10c of the connecter using the interconnecter 50 and the projections 55, the thermo-compression method using the pressing device may be used as discussed above.

In the third embodiment, when connecting the electrodes 12 with the wiring 10c by means of the thermo-compression method, the non-conductive particles 52 can be moved to the region away from between the electrodes 12 and wiring 10c in the adhesive layer 51 by means of pressure applied by the projections 55, and at the same time, the projections 55 can contact the opposing electrodes 12 to electrically connect with them. This may be because the projections 55 may be configured such that they have an increasingly smaller cross-section away from the wiring 10c toward the driving electrodes 12.

The moved non-conductive particles 42 may be disposed around the protections 55. Thus the projections 55, the driving electrodes 12, and the wiring 10c can remain insulated. Accordingly, a short circuit between neighboring electrodes 12 of the PDP 11 and the connecting wiring 10c may be prevented when the neighboring electrodes 12 and connecting wiring 10c are connected.

The connecting structure according to the present invention as stated above can be applied to electrodes of a liquid crystal display (LCD) panel and other flat panel displays as well as to other electronic devices.

As mentioned above, the present invention can provide a plasma display device in which improved interconnections prevent neighboring connecting terminal portions of an FPC and electrodes of a PDP from short-circuiting.

While this invention has been particularly shown and described in light of preferred embodiments, it will be understood by those skilled in the art that various changes may be made to the embodiments without departing from the invention.

What is claimed is:

1. A display device, comprising:
   a display panel;
   a driving circuit portion for driving the display panel;
   a connector for electrically connecting driving electrodes of the display panel and the driving circuit portion; and
   an interconnector for electrically connecting the connector with the display panel,
   wherein the interconnector comprises:
      an adhesive layer;
      a plurality of pellets arranged in the adhesive layer; and
      wherein the pellets are a substantially conducting medium within a first region where wiring of the connector overlaps the driving electrodes of the display panel, and the pellets are a substantially insulating medium at a second region other than the first region,
      wherein the interconnector further comprises non-conductive particles within the first region, and the pellets are larger than the non-conductive particles.

2. The display device of claim 1, wherein the pellets in the first region comprise an insulating bead and a conductive film layer covering the insulating bead, and at least one part of the conductive film layer is exposed when an insulating capsule formed on the conductive film layer is broken to electrically connect the driving electrode and wiring of the connector.

3. The display device of claim 2, wherein the insulating bead comprises polystyrene.

4. The display device of claim 2, wherein the conductive film comprises Au and Ni sequentially coated on the insulating bead.

5. The display device of claim 1, wherein the pellets in the second region comprise an insulating bead, a conductive film covering the insulating bead, and an insulating capsule formed on the conductive film.

6. The display device of claim 1, wherein the pellets have a size of about 4 to about 8 μm.

7. The display device of claim 1, wherein the non-conductive particles have a size of about 1 to about 2 μm.

8. A display device, comprising:
   a display panel;
   a driving circuit portion for driving the display panel;
   a connector to electrically connect electrodes of the display panel with the driving circuit portion;
   an interconnector to electrically connect the connector with the display panel; and
   projections projecting from wiring of the connector or the electrodes or both, the projections disposed between the wiring of the connector and the electrodes of display panel to electrically connect the connector to the electrodes.

9. The display device of claim 8, wherein the projections project from the wiring and have a progressively smaller cross-section from the wiring toward the electrodes.

10. The display device of claim 8, wherein the interconnector comprises an adhesive layer and a plurality of non-conductive particles dispersed in the adhesive layer.

11. An interconnector for electrically connecting a connector with a display panel, comprising:
    an adhesive layer; and
    a plurality of pellets and a plurality of non-conductive particles dispersed in the adhesive layer,
    wherein the pellets comprise a plurality of conductive balls with insulating capsules formed thereon, and the non-conductive particles are smaller than the pellets.

12. The interconnector of claim 11, wherein the conductive balls comprise an insulating bead; and
    a conductive film covering the insulating bead.

13. A method for electrically connecting driving electrodes with wiring of a connector incorporating a driving integrated circuit (IC), comprising:
    disposing an interconnector, including non-conductive particles and a plurality of pellets that comprise a plurality of conductive balls with insulating capsules formed thereon dispersed in an adhesive layer, on a portion of a display panel having the driving electrodes;
    locating the connector on a portion of the display panel to overlap the driving electrodes with wiring of the connector;
    heating and pressuring the interconnector such that the insulating capsules of the pellets interposed between the driving electrodes and the wiring burst, enabling the conductive balls exposed from the burst insulating capsules to electrically connect the driving electrodes and the wiring,
    wherein the non-conductive particles are smaller than the pellets.

* * * * *